United States Patent
Schroeder et al.

(10) Patent No.: US 6,821,897 B2
(45) Date of Patent: Nov. 23, 2004

(54) METHOD FOR COPPER CMP USING POLYMERIC COMPLEXING AGENTS

(75) Inventors: David J. Schroeder, Aurora, IL (US); Phillip Carter, Naperville, IL (US); Jeffrey P. Chamberlain, Aurora, IL (US); Kyle Miller, Oswego, IL (US); Isaac K. Cherian, Aurora, IL (US)

(73) Assignee: Cabot Microelectronics Corporation, Aurora, IL (US)

(*) Notice: Subject to any disclaimer, the term of this patent is extended or adjusted under 35 U.S.C. 154(b) by 259 days.

(21) Appl. No.: 10/246,280

(22) Filed: Sep. 18, 2002

(65) Prior Publication Data

US 2003/0124959 A1 Jul. 3, 2003

Related U.S. Application Data

(60) Provisional application No. 60/336,654, filed on Dec. 5, 2001.

(51) Int. Cl.[7] .................. H01L 21/44; H01L 21/302
(52) U.S. Cl. .................. 438/692; 438/691; 438/693
(58) Field of Search .................. 438/690, 691, 438/692, 693

(56) References Cited

U.S. PATENT DOCUMENTS

| | | |
|---|---|---|
| 4,752,628 A | 6/1988 | Payne |
| 4,867,757 A | 9/1989 | Payne |
| 5,123,958 A | 6/1992 | Wiand |
| 5,352,277 A | 10/1994 | Sasaki |
| 5,489,233 A | 2/1996 | Cook et al. |
| 5,527,423 A | 6/1996 | Neville et al. |
| 5,860,848 A | 1/1999 | Loncki et al. |
| 5,876,490 A | 3/1999 | Ronay |
| 5,958,794 A | 9/1999 | Bruxvoort et al. |
| 5,968,280 A | 10/1999 | Ronay |
| 6,099,604 A | 8/2000 | Sandhu et al. |
| 6,117,220 A | 9/2000 | Kodama et al. |
| 6,117,775 A | 9/2000 | Kondo et al. |

(List continued on next page.)

FOREIGN PATENT DOCUMENTS

| | | |
|---|---|---|
| EP | 1 036 836 A1 | 9/2000 |
| EP | 1 104 778 A2 | 6/2001 |
| EP | 1 118 647 A1 | 7/2001 |
| JP | 64-87146 A | 3/1989 |
| JP | 2001-64631 A | 3/2001 |
| WO | WO 99/64527 A1 | 12/1999 |
| WO | WO 01/02134 A1 | 1/2001 |
| WO | WO 01/14496 A1 | 3/2001 |
| WO | WO 02 094957 A2 | 11/2002 |

OTHER PUBLICATIONS

Byung–Chan Lee, Duquette D J, Gutmann R J: "Synthesis of Model Alumina Slurries for Damascene Pattering of Copper" Materials Research Society Symposium Proceedings, vol. 671, 2001, pp. m2.7.1–m2.7.12, XP008016931.

Patent Abstracts of Japan vol. 2000, No. 20, Jul. 10, 2001 & JP 2001 064631 A (JSR Corp), Mar. 13, 2001.

*Primary Examiner*—Alexander Ghyka

(57) ABSTRACT

The invention provides a method of polishing a substrate comprising a metal layer comprising copper. The method comprises the steps of (i) providing a chemical-mechanical polishing system comprising a liquid carrier, a polishing pad, an abrasive, and a negatively-charged polymer or copolymer, (ii) contacting the substrate with the poloshing system, and (iii) abrading at least a portion of the substrate to polish the metal layer of the substrate. The negatively-charged polymer or copolymer comprises one or more monomers selected from sulfonic acids, sulfonates, sulfates, phosphonic acids, phosphonates, and phosphates, has a molecular weight of about 20,000 g/mol or more, and coats at least a portion of the abrasive such that the abrasive has a zeta potential value that is lowered upon interaction of the negatively-charged polymer or copolymer with the abrasive.

30 Claims, 7 Drawing Sheets

U.S. PATENT DOCUMENTS

| | | |
|---|---|---|
| 6,117,783 A | 9/2000 | Small et al. |
| 6,132,637 A | 10/2000 | Hosali et al. |
| 6,171,352 B1 | 1/2001 | Lee et al. |
| 6,218,305 B1 | 4/2001 | Hosali et al. |
| 6,303,049 B1 | 10/2001 | Lee et al. |
| 6,561,876 B1 * | 5/2003 | Tateyama et al. ............. 451/41 |
| 6,561,883 B1 * | 5/2003 | Kondo et al. ................. 451/63 |
| 6,582,761 B1 * | 6/2003 | Nishimoto et al. ......... 427/203 |
| 2001/0005009 A1 | 6/2001 | Tsuchiya et al. |
| 2002/0016073 A1 | 2/2002 | Kondo et al. |
| 2002/0037642 A1 | 3/2002 | Wake et al. |

* cited by examiner

METHOD FOR COPPER CMP USING POLYMERIC COMPLEXING AGENTS

CROSS-REFERENCE TO RELATED APPLICATIONS

This patent application claims the benefit of U.S. Provisional Patent Application No. 60/336,654, filed Dec. 5, 2001.

FIELD OF THE INVENTION

This invention pertains to a method of polishing a copper-containing substrate.

BACKGROUND OF THE INVENTION

Compositions and methods for planarizing or polishing the surface of a substrate, especially for chemical-mechanical polishing (CMP), are well known in the art. Polishing compositions (also known as polishing slurries) typically contain an abrasive material in an aqueous solution and are applied to a surface by contacting the surface with a polishing pad saturated with the polishing composition. Typical abrasive materials include silicon oxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium. Alternatively, the abrasive material may be incorporated into the polishing pad. U.S. Pat. No. 5,489,233 discloses the use of polishing pads having a surface texture or pattern, and U.S. Pat. No. 5,958,794 discloses a fixed abrasive polishing pad.

Conventional polishing systems and polishing methods typically are not entirely satisfactory at planarizing semiconductor wafers. In particular, polishing compositions and polishing pads can have less than desirable polishing rates, and their use in chemically-mechanically polishing semiconductor surfaces can result in poor surface quality. Because the performance of a semiconductor wafer is directly associated with the planarity of its surface, it is crucial to use a polishing composition and method that results in a high polishing efficiency, uniformity, and removal rate, and leaves a high quality polish with minimal surface defects.

The difficulty in creating an effective polishing system for semiconductor wafers stems from the complexity of the semiconductor wafer. Semiconductor wafers are typically composed of a substrate, on which a plurality of transistors has been formed. Integrated circuits are chemically and physically connected into a substrate by patterning regions in the substrate and layers on the substrate. To produce an operable semiconductor wafer and to maximize the yield, performance, and reliability of the wafer, it is desirable to polish select surfaces of the wafer without adversely affecting underlying structures or topography. In fact, various problems in semiconductor fabrication can occur if the process steps are not performed on wafer surfaces that are adequately planarized.

The use of polyelectrolytes in chemical-mechanical polishing compositions is commonly known in the art. In some cases, the polyelectrolytes are used as complexing agents for the surface layer to be removed. In other cases, the polyelectrolyte is added to modify the properties of the polishing composition by acting as a dispersant, a thickener, or a flocculating agent. And still, in yet other cases, the polyelectrolyte is used to modify the surface of the abrasive particle.

The following patents and patent applications disclose polishing compositions comprising polyelectrolytes that purportedly complex the surface of the substrate. U.S. Pat. No. 6,099,604 discloses a polishing composition comprising a solvent, abrasive particles, and a polycarboxylic acid chelating agent. The chelating agent purportedly stabilizes portions of the substrate that are dislodged by the chemical-mechanical polishing process. WO 99/64527 discloses a polishing composition comprising water, an abrasive, an oxidizer, optionally a complexing agent and/or a dispersant, and an organic polymer to attenuate removal of an oxide film. WO 01/14496 discloses a polishing composition comprising an organic polymer with a backbone containing at least 16 carbons, and optionally abrasive particles, dispersing agents that prevent agglomeration of the abrasive particles, oxidizing agents, and complexing agents. The organic polymer is designed to adhere to the surface of a polished wafer, thereby eliminating scratching and redeposition of residue. U.S. Pat. No. 6,117,775 discloses a polishing composition comprising less than 1 wt. % abrasive particles, oxidizing agents, organic acids, and surfactants which purportedly suppress etching and oxidation. U.S. Pat. No. 6,303,049 discloses a polishing composition comprising an abrasive, an abrasion enhancer (e.g., phosphorous acid), and a water-soluble anionic chemical (e.g., a acrylate, phosphate, sulfate, or sulfonate-containing compound, polymer, and/or copolymer). The anionic chemical purportedly coats the surface of the metal film during polishing.

The following patents and patent applications disclose polishing compositions comprising polyelectrolytes that purportedly act to modify the properties of the polishing compositions. U.S. Pat. No. 4,752,628 discloses a polishing composition consisting of finely divided inorganic abrasive, a biocide, carboxylic acid dispersant polymer, carboxylic acid polymer thickener, corrosion inhibitor, and optionally a lubricant. U.S. Pat. No. 4,867,757 discloses a polishing composition with a pH greater than 8.5 consisting of finely divided inorganic abrasive, carboxylic acid dispersant polymer, and a lubricant. U.S. Pat. No. 5,123,958 discloses a polishing composition comprising an abrasive, a gel-type carrier comprising a polyvinyl alcohol and water mixture, and optionally a polyelectrolyte flocculating agent. U.S. Pat. No. 5,352,277 discloses a polishing composition comprising water, colloidal silica, a water-soluble polymeric compound, and a water-soluble salt at alkaline pH. The polymeric compound purportedly aids in forming a regular laminar flow between the polishing pad and the substrate surface during polishing. U.S. Pat. No. 5,860,848 discloses a polishing composition comprising water, submicron silica particles, a salt, an amine compound, and a polyelectrolyte at pH 8-11. The polyelectrolyte purportedly reduces particle adhesion to the substrate surface. U.S. Pat. No. 6,117,220 discloses a polishing composition comprising water, polystyrenesulfonic acid, an inorganic or organic acid, and an abrasive. The polystyrenesulfonic acid purportedly functions to flocculate the abrasive particles producing a polishing composition with good anti-foaming properties and low incidence of surface pitting during chemical-mechanical polishing. U.S. Pat. No. 6,117,783 discloses a polishing composition comprising a hydroxylamine compound and sufficient polyelectrolyte to repel particles away from each other and the surface of the substrate. U.S. Pat. No. 6,132,637 discloses a polishing composition comprising an aqueous medium, an abrasive, a surfactant, an organic polymer, and a complexing agent with two or more acid groups capable of complexing silica and silicon nitride. The organic polymer purportedly acts to enhance the viscosity of the polishing composition and to inhibit scratching of the substrate being polished with the polishing composition. U.S. Pat. No. 6,171,352 discloses a polishing composition comprising an aqueous medium, abrasive, an abrasion accelerator, and optionally a nitrate salt or anionic surfactant (e.g., polycarboxylic acid) that reduces the viscosity of the polishing composition. JP 1087146 discloses a polishing composition comprising an abrasive and polystyrene sulfonic acid, which purportedly is used as a dispersant and improves polishing performance.

The following patents and patent applications disclose polishing compositions comprising abrasive particles that purportedly electrostatically interact with the polyelectrolyte. U.S. Pat. No. 5,876,490 discloses a polishing composition comprising abrasive particles and a polyelectrolyte (molecular weight of 500 to 10,000) with a charge that differs from that of the abrasive particles. The polyelectrolyte purportedly coats the surface of the abrasive particles leading to improved polishing behavior. EP 1 036 836 A1 discloses a polishing composition comprising an aqueous dispersion of polymer particles of thermoplastic resins and inorganic particles that have opposite zeta potentials and are bonded by electrostatic force. Similarly, EP 1 104 778 A2 discloses a polishing composition comprising composite particles consisting of inorganic particles and polymer particles of opposite zeta potential. EP 1 118 647 A1 discloses a polishing composition comprising an abrasive, an oxidizer, a co-oxidizer, and an anti-coagulation agent. The anti-coagulation agent is purportedly used to stabilize molecular weight is described for the anti-coagulation agent. JP 200164631 discloses a polishing composition comprising abrasives and a polymer or copolymer comprising sulfonic acid groups (MW of about 5,000 to about 20,000). The polymer purportedly adheres to the polishing waste created during chemical mechanical polishing. WO 01/02134 discloses a polishing composition comprising an aqueous medium and abrasive particles that are maintained in a meta-stable phase by the presence of ionic species (e.g., polyelectrolytes and surfactants) that coat the surface of the abrasive particles.

A need remains, however, for polishing systems and polishing methods that will exhibit desirable polarization efficiency, uniformity, and removal rate during the polishing and polarization of substrates, while minimizing defectivity, such as surface imperfections and damage to underlying structures and topography during polishing and polarization.

The invention seeks to provide such a chemical-mechanical polishing system and method. These and other advantages of the invention will be apparent from the description of the invention provided herein.

BRIEF SUMMARY OF THE INVENTION

The invention provides a method of polishing a substrate comprising a metal layer comprising copper, wherein said method comprises the steps of (i) providing a chemical-mechanical polishing system comprising (a) a liquid carrier, (b) a polishing pad, (c) an abrasive, and (d) a negatively-charged polymer or copolymer, (ii) contacting a substrate comprising a metal layer comprising copper with the chemical-mechanical polishing system, and (iii) abrading at least a portion of the substrate to polish the metal layer of the substrate. The negatively-charged polymer or copolymer comprises one or more monomers selected from the group consisting of sulfonic acids, sulfonates, sulfates, phosphonic acids, phosphonates, and phosphates, has a molecular weight of about 20,000 g/mol or more, and coats at least a portion of the abrasive such that the abrasive has a zeta potential value that is lowered upon interaction of the negatively-charged polymer or copolymer with the abrasive.

DETAILED DESCRIPTION OF THE INVENTION

Figure 1:
FIG. 1 is a SEM image of a first region of a substrate comprising copper and silicon oxide layers after chemical-mechanical polishing with a polishing composition, comprising 0.5 wt. % alumina, 0.054 wt. % polystyrenesulfonic acid, 1 wt. % polyacrylic acid, 3 wt. % hydrogen peroxide, and water, illustrating the presence of "orange peel" surface defects.

The invention is directed to a chemical-mechanical polishing (CMP) system for use in the polishing of substrate comprising a copper-containing metal layer. The chemical-mechanical polishing system comprises (a) a liquid carrier, (b) a polishing pad, (c) an abrasive, and (d) a negatively-charged polymer or copolymer.

The chemical-mechanical polishing system described herein comprises an abrasive and a polishing pad. The abrasive can be in any suitable form (e.g., abrasive particles). The abrasive can be fixed on the polishing pad and/or can be in particulate form and suspended in the liquid carrier. The polishing pad can be any suitable polishing pad. The abrasive (when suspended in the liquid carrier) and the negatively-charged polymer or copolymer, as well as any other components suspended in the liquid carrier, form the polishing composition of the CMP system.

The abrasive can be any suitable abrasive, for example the abrasive can be natural or synthetic, and can comprise diamond (e.g., polycrystalline diamond), garnet, glass, carborundum, metal oxide, carbide, nitride, and the like. The abrasive desirably comprises a metal oxide. Suitable metal oxides include metal oxides selected from the group consisting of alumina, silica, titania, ceria, zirconia, germania, magnesia, co-formed products thereof, and combinations thereof. Preferably, the metal oxide is alumina. The abrasive particles typically have an average particle size (e.g., average particle diameter) of about 20 nm to about 500 nm. Preferably, the abrasive particles have an average particle size of about 70 nm to about 300 nm (e.g., about 100 nm to about 200 nm).

When the abrasive is suspended in the liquid carrier (i.e., when the abrasive is a component of the polishing composition), any suitable amount of abrasive can be present in the polishing composition. Typically, about 0.01 wt. % or more (e.g., about 0.05 wt. % or more) abrasive will be present in the polishing composition. More typically, about 0.1 wt. % or more abrasive will be present in the polishing composition. The amount of abrasive in the polishing composition typically will not exceed about 20 wt. %, more typically will not exceed about 10 wt. % (e.g., will not exceed about 5 wt. %). Preferably, the amount of abrasive in the polishing composition is about 0.05 wt. % to about 2 wt. %, more preferably about 0.1 wt. % to about 1 wt. %, most preferably about 0.5 wt. %.

The negatively-charged polymer or copolymer interacts, typically electrostatically, with the abrasive, which is suspended in the carrier or fixed on the polishing pad, so as to coat at least a portion of the surface of the abrasive. The polymer or copolymer is negatively-charged and associates with abrasive that has a suitable zeta potential at the pH of the CMP system. The zeta potential of an abrasive particle refers to the potential across the interface of solids and liquids, specifically the potential across diffuse layers of ions surrounding charged colloidal particles. The zeta potential of the abrasive will vary with pH. For example, an abrasive with a positive zeta potential can interact electrostatically with the negatively-charged polymer or copolymer. Also, an abrasive with a slightly negative zeta potential having sufficient positive sites on the abrasive surface can interact electrostatically with one or more negatively-charged polymers or copolymers. The abrasive preferably has a positive zeta potential at the pH of the CMP system. The zeta potential value of the abrasive is lowered upon interaction of the negatively-charged polymer or copolymer with the abrasive.

The presence of the negatively-charged polymer or copolymer can result in a partially or wholly coated abrasive (e.g., partially or wholly coated abrasive particles or a partially or wholly coated abrasive polishing pad). The abrasive can be coated in situ, before addition of additional molecular or polymeric organic acid during the CMP process, or can be coated ex situ and stored for later use in a CMP process. The polymer-coated abrasive particles typically have a mean particle size of about 100 nm to about 300 nm, preferably about 150 nm to about 200 nm (e.g., about 170 nm).

The negatively-charged polymer or copolymer comprises one or more monomers selected from the group consisting of sulfonic acids, sulfonates, sulfates, phosphonic acids, phosphonates, and phosphates. More preferably, one or more monomers are selected from the group consisting of styrenesulfonic acid, vinylsulfonic acid, vinylphosphonic acid, and 2-acrylamido-2-methylpropane sulfonic acid (AMPS). The negatively-charged polymer or copolymer can contain only the monomers recited above, or can contain one or more of those monomers in combination with other nonionic monomers, for example, ethylene oxide, propylene oxide, or styrene. Nonionic monomers can be present in the polymer or copolymer to introduce a spatial relationship between the negatively-charged monomers. The number of nonionic monomers present in the negatively-charged polymer or copolymer desirably does not exceed about 75% (by number) of the total monomers. The copolymer can be a random copolymer, alternating copolymer, periodic copolymer, block copolymer (e.g., AB, ABA, ABC, etc.), graft copolymer, or comb copolymer. Preferably, the polymer or copolymer is polystyrenesulfonic acid, poly(2-acrylamido-2-methylpropane sulfonic acid), or poly (styrenesulfonic acid-co-maleic anhydride).

The negatively-charged polymer or copolymer typically has a molecular weight of about 20,000 g/mol or more. Also, the negatively-charged polymer or copolymer typically has a molecular weight of about 1,000,000 g/mol or less. Preferably, the negatively-charged polymer or copolymer has a molecular weight of about 40,000 g/mol or more (e.g., about 40,000 g/mol to about 500,000 g/mol) or about 50,000 g/mol or more (e.g., about 50,000 g/mol to about 500,000 g/mol). More preferably, the negatively-charged polymer or copolymer has a molecular weight of about 60,000 g/mol or more (e.g., about 60,000 g/mol to about 500,000 g/mol, or about 60,000 g/mol to about 250,000 g/mol), or even about 70,000 g/mol or more (e.g., about 70,000 g/mol to about 250,000 g/mol, or about 70,000 g/mol to about 150,000 g/mol).

The amount of the abrasive and the amount of negatively-charged polymer or copolymer described herein for the CMP system are related inasmuch as the negatively-charged polymer or copolymer coats at least a portion of the abrasive. The wt. % amount of the negatively-charged polymer or copolymer desirably is about 0.05 to about 0.2 times the wt. % amount of abrasive. For example, the polishing composition typically comprises about 0.01 wt. % to about 2 wt. % of the negatively-charged polymer or copolymer and about 0.1 wt. % to about 20 wt. % abrasive. Preferably, the polishing composition comprises about 0.2 wt. % or less of the negatively-charged polymer or copolymer and about 2 wt. % or less abrasive. More preferably, the polishing composition comprises about 0.02 wt. % to about 0.05 wt. % of the negatively-charged polymer or copolymer and about 0.2 wt. % to about 0.5 wt. % abrasive.

The CMP system optionally further comprises a polymeric complexing agent comprising carboxylic acid-containing monomers, carboxylate-containing monomers, or combinations thereof. The polymeric complexing agent has an overall negative charge (e.g., the polymeric complexing agent is a negatively-charged polyelectrolyte). The monomers can be dicarboxylic acids or dicarboxylates, for example maleic acid and itaconic acid. The polymeric complexing agent can be polyacrylic acid, polymethacrylic acid, polymaleic acid, a saturated or unsaturated polycarboxylic acid, or salt thereof. The polymeric complexing agent also can be a copolymer comprising one or more carboxylic acid- or carboxylate-containing monomers in combination with anionic or nonionic comonomers. The copolymer can be a random copolymer, alternating copolymer, periodic copolymer, or block copolymer (e.g., AB, ABA, ABC). The copolymer also can be a graft copolymer, in which a polymer backbone is graft-functionalized with different polymer side chains, or a comb/brush copolymer with regular polymeric side chains. In some embodiments, the CMP system comprises two or more of such polymeric complexing agents. For example, the CMP system may comprise a mixture of polyacrylic acid and polymethacrylic acid.

When the polymeric complexing agent is a copolymer, it may be desirable to introduce various comonomers that will modify the hydrophilicity of the polymeric complexing agent. For example, comonomers containing sulfonic acid, sulfonate, alcohol (e.g., vinyl alcohol), acetate (e.g., vinyl acetate), epoxide, or pyrrolidone functional groups can increase the hydrophilicity of the polymeric complexing agent. Comonomers containing methacrylate, styrene, vinyl, and vinyl butyral functional groups can decrease the hydrophilicity of the polymeric complexing agent. The hydrophilicity of the polymeric complexing agent also can be reduced through the use of carboxylic acid or carboxylate-containing comonomers in which the carboxylic acid or carboxylate group is spatially removed from the backbone of the polymeric complexing agent by two or more carbons.

The polymeric complexing agent interacts with the surface of a substrate to be polished. The ability of the polymeric complexing agent to complex the surface of the substrate can be modified through the incorporation of comonomers containing functional groups with reduced ability to complex the substrate surface. For example, monomers containing sulfate, phosphate, phosphonic acid, phosphonate, pyridine, nitrile (e.g., acrylonitrile), amide (e.g., acrylamide), and halide (e.g., vinyl chloride) functional groups can be incorporated in the polymeric complexing agent. Nonionic comonomers also can be incorporated, for example, ethylene, propylene, ethylene oxide, propylene oxide, and styrene, to modify the properties of the polymeric complexing agent. The structure of the polymeric complexing agent can be modified through the introduction of cross-links between the polymer backbones of two or more of the polymeric complexing agents.

Thus, the interaction between the polymeric complexing agent and the substrate surface can be fine-tuned through the incorporation of various comonomers. The comonomers discussed above can be co-polymerized with carboxylic acid- or carboxylate-containing monomers or can be introduced within polymer side chains on polycarboxylic acid/polycarboxylate main chains in the form of graft, comb, or brush copolymers. For example, polyethylene glycol (PEG) chains can be introduced along a polyacrylic acid backbone.

Suitable examples of polymeric complexing agents, which are copolymers, include poly(acrylic acid-co-2-acrylamido-2-methylpropane sulfonic acid (AMPS)), poly (ethylene-co-methacrylic acid or acrylic acid), poly (acrylamide-co-acrylic acid or methacrylic acid), poly (acrylamide-co-methacrylic acid-co-maleic anhydride), poly (acrylamide-co-N,N-dialkylaminoethyl acrylate or methacrylate), poly(AMPS-co-acrylic acid-co-AMPS), poly (ethylene-co-methylacrylate-co-acrylic acid), poly (ethylacrylate-co-methacrylic acid-co-3-(1-isocyanato-1-methylethyl)-α-methylstyrene) adducts, poly(acrylic acid-co-maleic acid), poly(acrylic acid-co-maleic anhydride), poly(acrylic acid-co-maleic anhydride-co-AMPS), poly (acrylic acid-co-maleic anhydride-co-3-acrylamido-3-methyl-butanoic acid), poly(acrylic acid-co-maleic anhydride-co-polyoxyethylene heptadecyl ethyl methylene succinate), poly(acrylic acid-graft-poly(ethylene oxide)), poly(acrylonitrile-co-butadiene-co-acrylic acid), poly (acrylic acid-co-sulfonic acid), poly(acrylic acid-co-sulfonic acid-co-styrene sulfonate), poly(acrylic acid-co-AMPS), poly(acrylic acid-co-AMPS-co-tert-butylacrylamide), poly (acrylic acid-co-AMPS-co-dimethyldiallylammonium chloride), poly(acrylic acid-co-AMPS-co-alkylene oxide), poly(acrylic acid-co-AMPS-co-sodium hypophosphite), poly(acrylic acid-co-AMPS-co-styrene sulfonic acid), poly (acrylic acid-co-AMPS-co-vinyl acetate), poly(acrylic acid-co-AMPS-co-vinyl alcohol), poly(acrylic acid-co-AMPS-co-AMPS-co-1-vinyl-2-pyrrolidone), poly(acrylic acid-co-allyl benzene sulfonate), poly(acrylic acid-co-acrylamide), poly(acrylic acid-co-acrylamide-co-alkoxyalkyl acrylate), poly(acrylic acid-co-acrylamide-co-alkoxyalkyl methacrylate), poly(acrylic acid-co-alkyl methacrylate), poly(acrylic acid-co-cross linking agent-co-alkyl methacrylate), poly(acrylic acid-co-hydroxyalkyl acrylate or methacrylate), poly(acrylic acid-co-hydroxyalkyl acrylate or methacrylate-co-dimethyldiallylammonium chloride), poly (acrylic acid-co-hypophosphorus acid), poly(acrylic acid-co-methacrylic acid), poly(methylmethacrylate-co-methacrylic acid), poly(acrylic or methacrylic acid-co-alkyl acrylate-co-alkyl methacrylate), poly(ammonium acrylate-co-alkyl acrylate), poly(ammonium methacrylate-co-alkyl acrylate or methacrylate), poly(tert-butyl methacrylate-co-dimethylaminoethyl methacrylate), poly(methacrylic acid-co-alkyl acrylate or methacrylate), poly(methacrylic acid-co-aminoalkyl acrylate or methacrylate), poly(methacrylic acid-co-hydroxyalkyl acrylate or methacrylate), poly (methacrylic acid-co-tert-butyl acrylate-co-ethyl acrylate), poly(methacrylic acid-co-ethyl acrylate-co-polyoxyethylene alkyl/alkyl phenol/dialkyl phenol ethyl methylene succinate), poly(methacrylic acid-co-ethyl acrylate-co-sorbitan monooleate polyoxyethylene methyl oxycarbonyl amino dimethyl isopropenyl benzene), poly(methacrylic acid-co-hydroxyalkyl acrylate-co-butyl acrylate), poly (methacrylic acid-co-octylacrylamide-co-butylaminoethyl methacrylate), poly(methacrylic acid-co-alkyl acrylate or methacrylate), poly(acrylate-co-acrylamide-co-acrylonitrile), poly(acrylate-co-alkyl acrylate), poly(acrylic acid-co-2-acrylamido tert-butyl sulfonic acid), poly(strene-co-acrylic or methacrylic acid), poly(styrene-co-alkyl methacrylate or acrylate), and poly(vinyl alcohol-co-vinyl acetate-co-itaconic acid). Typical alkyl acrylates and methacrylates include lower alkyl groups like methyl, ethyl, propyl, butyl, pentyl, and the like. The alkyl groups can contain additional functional groups, for example, amines, hydroxyl groups, pyridyl groups, and the like.

The polymeric complexing agent preferably is selected from the group consisting of polyacrylic acid, poly(acrylic acid-co-2-acrylamido-2-methylpropane sulfonic acid (AMPS)), or a combination thereof. The polymeric complexing agent typically comprises at least about 10% (by number) or more monomers containing carboxylic acid or carboxylate functional groups. Preferably, the number of carboxylic acid or carboxylate containing monomers is about 20% or more of the total number of monomers (e.g., about 30% or more). The polymeric complexing agent typically has a molecular weight of about 5,000 g/mol or more (e.g., about 10,000 g/mol or more, or about 25,000 g/mol or more) and about 500,000 g/mol or less (e.g., about 300,000 g/mol or less, or about 100,000 g/mol or less). Preferably, the molecular weight is about 10,000 g/mol to about 100,000 g/mol (e.g., about 30,000 g/mol to about 70,000 g/mol, or about 40,000 g/mol to about 60,000 g/mol).

The polymeric complexing agent can be present in the CMP system, particularly the polishing composition thereof, in any suitable amount. For example, the polishing composition typically comprises about 0.01 wt. % or more (e.g., about 0.01 wt. % to about 5 wt. %) polymeric complexing agent based on the weight of the liquid carrier and any components dissolved or suspended therein. Preferably, the polishing composition comprises about 0.1 wt. % to about 3 wt. % (e.g., about 0.5 wt. % to about 2 wt. %) polymeric complexing agent. More preferably, the polishing composition comprises about 1 wt. % polymeric complexing agent.

In some embodiments, the polishing composition comprises about 2 wt. % or less abrasive, about 0.2 wt. % or less of the negatively-charged polymer or copolymer, and about 1 wt. % or less of the polymeric complexing agent. More preferably, the polishing composition comprises about 0.2 wt. % to about 0.5 wt. % abrasive, about 0.02 wt. % to about 0.05 wt. % of the negatively-charged polymer or copolymer, and 0.8 wt. % to about 1 wt. % of the polymeric complexing agent. For example, the polishing composition typically comprises about 0.1 wt. % to about 10 wt. % abrasive, about 0.01 wt. % to about 1 wt. % of the negatively-charged polymer or copolymer, and about 0.6 wt. % (e.g., about 0.59 wt. %) to about 1 wt. % of the polymeric complexing agent.

The CMP system optionally comprises suitable polymeric complexing agents in addition to those specifically recited herein. Such additional polymeric complexing agents, as well as any other components, can be present in the CMP system in any suitable amount, for example, about 0.01 wt. % or more and about 10 wt. % or less, based on the weight of the liquid carrier and any components dissolved or suspended therein.

The CMP system optionally further comprises a non-polymeric complexing agent, especially an organic acid. The organic acid typically is a carboxylic acid, or a di- or tri-carboxylic acid. The organic acid typically is a carboxylic acid selected from the group consisting of lactic acid, tartartic acid, citric acid, malonic acid, phthalic acid, succinic acid, glycolic acid, propionic acid, acetic acid, salicylic acid, picolinic acid, 2-hydroxybutyric acid, 3-hydroxybutyric acid, 2-methyl lactic acid, and combinations thereof. The organic acid preferably is any organic acid capable of increasing the removal rate of a substrate surface layer (e.g., copper) by more than 20% (preferably, by more than 10%). More preferably, the organic acid is selected from the group consisting of lactic acid, propionic acid, 2-hydroxybutyric acid, 3-hydroxybutyric acid, 2-methyl lactic acid, salts thereof, and combinations thereof. Lactic acid and 2-methyl lactic acid are particularly preferred in some embodiments.

The CMP system optionally comprises both the polymeric complexing agent and the organic acid described above. In such embodiments, the organic acid desirably is present in the polishing composition in an amount that is less than the amount of the polymeric complexing agent such that the organic acid does not function as a primary complexing agent on the copper-containing metal layer of the substrate to be polished. For example, the polishing composition typically comprises about 1 wt. % or less organic acid. Preferably, the polishing composition contains an amount of organic acid that is about 90% or less than the amount of polymeric complexing agent on a weight basis. More preferably, the amount of organic acid is about 80% or less than the amount of the polymeric complexing agent on a weight basis. Most preferably, the amount of organic acid is about 70% or less than the amount of the polymeric complexing agent on a weight basis. In addition, the amount of organic acid preferably is about 10% or more (e.g., about 20% or more) than the amount of the polymeric complexing agent on a weight basis. Most preferably, the amount of organic acid preferably is about 30% or more (e.g., about 40% or more) than the amount of the polymeric complexing agent on a weight basis. The amount of organic acid and polymeric complexing agent are given based on the weight of the liquid carrier and any additional components dissolved or suspended therein.

When the CMP system comprises both a polymeric complexing agent and an organic acid, the CMP system typically comprises about 0.6 wt. % to about 2 wt. % of the polymeric complexing agent and about 0.5 wt. % to about 1 wt. % organic acid. Preferably, the CMP system comprises about 1 wt. % of the polymeric complexing agent and about 0.7 wt. % organic acid. The amount of organic acid affects the presence or absence of surface defects during substrate polishing. For example, too much organic acid leads to unacceptable pitting of the surface of the substrate. Too little organic acid leads to a rough "orange peel" surface topography and unacceptable erosion and dishing. One especially preferred polishing composition comprises about 0.05 wt. % polystyrenesulfonic acid, about 0.5 wt. % alumina abrasive, about 1 wt. % polyacrylic acid, and about 0.7 wt. % lactic acid.

In one embodiment, the abrasive of the CMP system is present in the liquid carrier and is colloidally stable. Colloid refers to the suspension of abrasive particles in the liquid carrier. Colloidal stability refers to the maintenance of that suspension through time. In the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.8 (i.e., $\{[B]-[T]\}/$

[C]≦0.8). Preferably, {[B]–[T]}/[C]≦0.7 (e.g., {[B]–[T]}/[C]≦0.5). Conventional chemical-mechanical polishing compositions comprising colloidal abrasive particles not coated by at least one negatively-charged polymer or copolymer agglomerate upon addition of an organic acid and settle, causing undesirable defects on the surface of the substrate being polished. Contrastingly, polymer-coated abrasive particles in the CMP system described herein can exist as stable colloidal suspensions, even when the CMP system further comprises a polymeric complexing agent and/or an organic acid.

A liquid carrier is used to facilitate the application of the abrasive (when suspended in the liquid carrier), negatively-charged polymer or copolymer, and any optional additives to the surface of a suitable substrate to be polished or planarized. The liquid carrier is typically an aqueous carrier and can be water alone, can comprise water and a suitable water-miscible solvent, or can be an emulsion. Suitable water-miscible solvents include alcohols such as methanol, ethanol, etc. Preferably, the aqueous carrier consists of water, more preferably deionized water.

The pH of the CMP system is maintained in a range suitable for its intended end-use (e.g., from about 2 to about 12). The pH used in the CMP system is dependent on several factors including (i) the zeta potential of the abrasive particles and (ii) the type of substrate to be polished. The abrasive particles coated with a negatively-charged polymer or copolymer are stable over a wide pH range (e.g., from about 2 to about 9). Before pH adjustment (e.g., by addition of a suitable acidic or alkaline substance to the CMP system), the pH of the chemical-mechanical polishing system typically will be about 7 or less (e.g., about 5 or less). When the CMP system is used in conjunction with polishing a copper-containing substrate, the pH is desirably about 7 or preferably about 3 to about 6, more preferably about 3.5 to about 5. Most preferably, the pH is about 4.

The CMP system optionally further comprises a means of oxidizing one or more components of a metal layer comprising copper. The means for oxidizing the metal layer comprising copper can be any suitable means for oxidizing the metal layer, which includes any physical or chemical means. In a CMP system involving electrochemical polishing, preferably the means for oxidizing the substrate comprises a device for applying a time-varying potential (e.g., anodic potential) to the substrate comprising the metal layer (e.g., electronic potentiostat). In a CMP system that does not involve electrochemical polishing, preferably the means for oxidizing the metal layer is a chemical oxidizing agent.

The device for applying time-varying potential to the substrate can be any suitable such device. The means for oxidizing the substrate preferably comprises a device for applying a first potential (e.g., a more oxidizing potential) during an initial stage of the polishing and applying a second potential (e.g., a less oxidizing potential) at or during a later stage of polishing, or a device for changing the first potential to the second potential during an intermediate stage of polishing, e.g., continuously reducing the potential during the intermediate stage or rapidly reducing the potential from a first, higher oxidizing potential to a second, lower oxidizing potential after a predetermined interval at the first, higher oxidizing potential. For example, during the initial stage(s) of the polishing, a relatively high oxidizing potential is applied to the substrate to promote a relatively high rate of oxidation/ dissolution/removal of the substrate. When polishing is at a later stage, e.g., when approaching an underlying barrier layer, the applied potential is reduced to a level producing a substantially lower or negligible rate of oxidation/dissolution/removal of the substrate, thereby eliminating or substantially reducing dishing, corrosion, and erosion. The time-varying electrochemical potential is preferably applied using a controllably variable DC power supply, e.g., an electronic potentiostat. U.S. Pat. No. 6,379,223 further describes a means for oxidizing a substrate by applying a potential.

The chemical oxidizing agent can be any suitable oxidizing agent. Suitable oxidizing agents include inorganic and organic per-compounds, bromates, nitrates, chlorates, chromates, iodates, iron and copper salts (e.g., nitrates, sulfates, EDTA, and citrates), rare earth and transition metal oxides (e.g., osmium tetraoxide), potassium ferricyanide, potassium dichromate, iodic acid, and the like. A per-compound (as defined by Hawley's Condensed Chemical Dictionary) is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($SO_5^{2-}$), dipersulfates ($S_2O_8^{2-}$), and sodium peroxide. Examples of compounds containing an element in its highest oxidation state include but are not limited to periodic acid, periodate salts, perbromic acid, perbromate salts, perchloric acid, perchlorate salts, perboric acid, perborate salts, and permanganates. The oxidizing agent preferably is hydrogen peroxide. The polishing system, especially the CMP system (particularly the polishing composition), typically comprises about 0.1 wt. % to about 15 wt. % (e.g., about 0.2 wt. % to about 10 wt. %, about 0.5 wt. % to about 8 wt. %, or about, 1 wt. % to about 5 wt. %) oxidizing agent, based on the weight of the liquid carrier and any compounds dissolved or suspended therein.

The CMP system optionally further comprises a corrosion inhibitor (i.e., a film-forming agent). The corrosion inhibitor can be any suitable the corrosion inhibitor is an organic compound containing a heteroatom-containing functional group. For example, the film-forming agent is a heterocyclic organic compound with at least one 5- or 6-member heterocyclic ring as the active functional group, wherein the heterocyclic ring contains at least one nitrogen atom, for example, an azole compound. Preferably, the film-forming agent is a triazole, more preferably, 1,2,4-triazole, 1,2,3-triazole, or benzotriazole. The amount of typically is about 0.0001 wt. % to about 3 wt. %, preferably about 0.001 wt. % to about 2 wt. % based on the weight of the liquid carrier and any components dissolved or suspended therein.

The CMP system optionally further comprises a non-ionic surfactant. Preferably, the CMP system comprises a non-ionic surfactant. One example of a suitable nonionic surfactant is an ethylenediamine polyoxyethylene surfactant. The amount of nonionic surfactant typically is about 0.0001 wt. % to about 1 wt. % (preferably about 0.001 wt. % to about 0.1 wt. %, or about 0.005 wt. % to about 0.05 wt. %) based on the weight of the liquid carrier and any components dissolved or suspended therein.

The CMP system optionally further comprises an anti-foaming agent. The anti-foaming agent can be any suitable anti-foaming agent. Suitable an but are not limited to, silicon-based and acetylenic diol-based antifoaming agents. The amount of anti-foaming agent present in the polishing composition typically is about 40 ppm to about 140 ppm.

The CMP system optionally further comprises a biocide. The biocide can be any suitable biocide, for example an isothiazolinone biocide. The amount of biocide used in the polishing composition typically is about 1 to about 50 ppm, preferably about 10 to about 20 ppm.

The CMP system is intended for use in the chemical-mechanical polishing of a substrate comprising at least one metal layer comprising copper. The method of polishing comprises the steps of (i) providing the chemical-mechanical polishing system, (ii) contacting the copper-containing metal layer of the substrate with the chemical-mechanical polishing system, and (iii) abrading at least a portion of the metal layer of the substrate to polish the metal layer of the substrate. The substrate can be any suitable copper-containing substrate (e.g., an integrated circuit, metals, ILD layers, semiconductors, thin films, MEMS, magnetic heads) and can further comprise any suitable insulating, metal, or metal alloy layer (e.g., metal conductive layer). The insulating layer can be a metal oxide, porous metal oxide, glass, organic polymer, fluorinated organic polymer, or any other suitable high or low-κ insulating layer. The insulating layer preferably is a silicon-based metal oxide. The substrate preferably further comprises a metal layer comprising tantalum, tungsten, or titanium.

When the CMP system comprises a polymeric complexing agent, at least 50% of the surface of the copper-containing metal layer of the substrate is complexed by the polymeric complexing agent under static conditions (i.e., a substrate comprising a copper-containing metal layer in the presence of the polishing pad). The complexation by the polymeric complexing agent the substrate using a polishing pad). The complexation by the polymeric complexing agent with the substrate surface forms a film with a thickness of about 100 Å to about 200 Å on the substrate surface. Based on that evidence, it is believed that during chemical-mechanical polishing, the metal layer comprising copper is s polymeric complexing agent. When the CMP system comprises the polymeric complexing agent in combination with an organic acid (e.g., a carboxylic acid), the surface of the metal layer comprising copper preferably is primarily complexed by the polymeric complexing agent and not by any organic acid. The CMP system is capable of planarizing or polishing a copper-containing metal layer of a substrate at a relatively high rate, with desirable polarization efficiency, uniformity, removal rate, and low defectivity. In particular, the CMP system of the invention gives rise to substantially lower fine line corrosion, dishing, and pitting of the copper-containing metal layer of the substrate.

The following examples further illustrate the invention but, of course, should not be construed as in any way limiting its scope.

EXAMPLE 1

This example illustrates a method for producing polymer-coated abrasive particles according to the invention.

Polystyrenesulfonic acid (MW=75,000) was dissolved in deionized water, and the pH was adjusted to between 3 and 4 with KOH. A defoaming agent was then added. Alumina particles were added to the mixture at a rate of 500 mL/min over 40-45 minutes. The mixture was subjected to high shear mixing for 10 minutes. The resulting polymer-coated particles had a mean particle size of about 170 nm. The zeta potential was measured to be less than −30 mV over a pH range of 2 to 9.

This example demonstrates that polymer-coated abrasive particles can easily be produced and stored for later use in a chemical-mechanical polishing process.

EXAMPLE 2

This example illustrates the colloidal stability of polymer-coated particle abrasives in the presence of non-polymeric organic acids.

The colloidal stability of five different abrasive compositions (Compositions 2A–2E), each containing 0.5 wt. % cationic alumina particles, 1 wt. % adjusted to a pH of 4 with KOH, was assessed over a 48 hour period. Composition 2A (comparative) contained alumina particles coated with 0.054 wt. % polyacrylic acid (MW=5,000). Composition 2B (invention) contained alumina particles coated with 0.054 wt. % polystyrenesulfonic acid/maleic anhydride copolymer (MW=20,000). Composition 2C (invention) contained alumina particles coated with 0.054 wt. % polystyrenesulfonic acid (MW=75,000). Composition 2D (invention) contained 0.49 wt. % alumina particles coated with 0.052 wt. % polystyrenesulfonic acid (MW=75,000) and 3 wt. % hydrogen peroxide. Composition 2E (control) contained alumina particles containing no polymer coating. The polymer-coated alumina particles were prepared according to the method described in Example 1.

After 48 hours, the compositions containing the polyacrylic acid-coated particles (Composition 2A) and the non-polymer coated particles (Composition 2E) were determined to be colloidally unstable. The compositions containing polystyrenesulfonic acid/maleic anhydride copolymer-coated alumina particles (Composition 2B) and polystyrenesulfonic acid polymer-coated alumina particles (Compositions 2C and 2D) remained colloidally stable.

These results demonstrate that the presence of a polymeric complexing agent coated onto the surface of the abrasive particle in accordance with the invention imparts stability to the colloidal abrasive suspension even in the presence of destabilizing organic acids.

EXAMPLE 3

This example illustrates that the presence of a polymer coating on the abrasive particle improves substrate removal rates and selectivity.

Similar substrates containing copper, tantalum, and silica layers were polished with two different chemical-mechanical polishing systems, each of which comprised the same polishing pad in conjunction with a different polishing composition (Polishing Compositions 3A and 3B). Polishing Composition 3A (control) contained uncoated alumina particles, and Polishing Composition 3B (invention) contained alumina particles coated with polystyrenesulfonic acid/maleic anhydride (PSSMA) copolymer. The removal rates for copper, tantalum, and silica were measured for each of the chemical-mechanical polishing systems. The colloidal stability of each of the chemical-mechanical polishing systems was assessed during the course of the chemical-mechanical polishing process. The removal rates (RR) for copper, tantalum, and silica, as well as colloidal stabilities, for the chemical-mechanical polishing systems are summarized in Table 1.

TABLE 1

| Removal rates for Copper, Tantalum, and Silica | | | | | |
|---|---|---|---|---|---|
| Polishing Composition | Cu RR (Å/min) | Ta RR (Å/min) | Silica RR (Å/min) | Cu/Ta RR Ratio | Cu/Silica RR Ratio | Colloidally Stable? |
| 3A (none) | 7722 | 79 | 8 | 97.7 | 965.3 | No |
| 3B (PSSMA) | 8267 | 62 | 8 | 133.3 | 1033.4 | Yes |

These results demonstrate that higher copper removal rates and improved selectivity can be obtained using abrasive particles that are coated with polymeric complexing agents in a composition of the invention.

EXAMPLE 4

This example illustrates the polishing effectiveness of abrasive particles coated with negatively-charged polymers or copolymers.

Similar substrates containing copper, tantalum, and silica layers were polished with three different chemical-mechanical polishing systems, each of which comprised the same polishing pad in conjunction with a different polishing composition (Polishing Compositions 4A, 4B, and 4C). Polishing Compositions 4A, 4B, and 4C contained 0.5 wt. % polymer-coated alumina, 1 wt. % organic acid, and corrosion inhibitor (benzotriazole) at a pH of 4. Polishing Composition 4A (comparative) contained polyacrylic acid-coated alumina particles (PAA). Polishing Composition 4B (invention) contained polystyrenesulfonic acid/maleic anhydride copolymer-coated alumina particles (PSSMA, MW=20,000). Polishing Composition 4C (invention) contained polystyrenesulfonic acid-coated alumina particles (PSS, MW=75,000).

The removal rates for copper, tantalum, and silica were measured for each of the chemical-mechanical polishing systems. The colloidal stability of each of the chemical-mechanical polishing systems was assessed during the course of the chemical-mechanical polishing process. The copper, tantalum, and silica removal rates (RR) along with the colloidal stabilities are summarized in Table 2.

TABLE 2

Copper, Tantalum, and Silica Removal Rates

| Polishing Composition | Cu RR (Å/min) | Ta RR (Å/min) | Silica RR (Å/min) | Cu/Ta RR Ratio | Cu/Silica RR Ratio | Colloidally Stable? |
|---|---|---|---|---|---|---|
| 4A (PAA) | 1889 | 100 | 13 | 18.9 | 145.3 | No |
| 4B (PSSMA) | 1777 | 75 | 16 | 23.7 | 111.1 | Yes |
| 4C (PSS) | 1931 | 65 | 15 | 29.7 | 128.7 | Yes |

These results demonstrate that the type of negatively-charged polymer or copolymer used to coat the surface of the abrasive particle has a significant effect on the colloidal stability of the polishing composition. The data for the polishing rates of copper, tantalum, and silica show that superior copper removal along with high selectivity of copper removal over tantalum and silica are obtained using higher MW polystyrene sulfonic acid-coated alumina particles.

EXAMPLE 5

This example compares the effect of colloidally stable abrasive particles coated with a negatively-charged polymer or copolymer and uncoated abrasive particles that are not colloidally stable on surface defects.

Similar patterned substrates containing copper and tantalum layers were polished with two different chemical-mechanical polishing systems, each of which comprised the same polishing pad in conjunction with a different polishing composition (Polishing Compositions 5A and 5B). Polishing Composition 5A (control) contained alumina with no polymeric complexing agent. Polishing Composition 5B (invention) contained alumina coated with polystyrenesulfonic acid/maleic anhydride copolymer (PSSMA, MW=20,000). The values for copper dishing (in angstroms) were measured for the bond pad (BP) region of the patterned substrate at the end of copper polishing and after 20% over-polishing (20% OP). The values for copper erosion (in angstroms) were measured for two regions of copper line density. The first region (E90) had 90% copper line density (4.5 µm Cu lines separated by 0.5 µm space), and the erosion was measured after polishing and after 20% over-polishing (20% OP). The second region (E50) had 50% copper line density (2.5 µm Cu lines separated by 2.5 µm space), and the erosion was measured at the end of copper polishing. The clear time (i.e., time required to remove the copper layer) and colloidal stability also were determined for both chemical-mechanical polishing systems. The dishing, erosion, clear time, and stability data for the two chemical-mechanical polishing systems are summarized in Table 3.

TABLE 3

Dishing, Erosion, Clear Time, and Colloidal Stability Values for Copper/Tantalum Bond Pad Polishing

| Polishing Composition | BP Dishing (Å) | BP Dishing 20% OP (Å) | E90 Erosion (Å) | E90 Erosion 20% OP (Å) | E50 Erosion (Å) | Clear Time (sec) | Colloidally Stable? |
|---|---|---|---|---|---|---|---|
| 5A (none) | 500 | 750 | 350 | 450 | 175 | 300–500 | No |
| 5B (PSSMA) | 720 | 675 | 520 | 560 | 168 | <300 | Yes |

These results demonstrate that similar dishing, erosion, and clear time values for a polished copper on tantalum bond pad can be obtained for polymer-coated abrasive particles (compared to uncoated abrasive particles) without losing colloidal stability in the polishing composition.

EXAMPLE 6

This example compares the substrate removal rates using CMP systems comprising abrasive particles coated with a negatively-charged polymer or copolymer with conventional CMP systems comprising uncoated negatively-charged abrasive particles.

Similar patterned substrates containing copper, tantalum, and silicon oxide layers were polished with two different chemical-mechanical polishing systems (Polishing Compositions 6A and 6B). Polishing Composition 6A (control) contained untreated silica, while Polishing Composition 6B (invention) contained polystyrenesulfonic acid-coated alumina (PSS, MW=75,000). The removal rates (RR) of the copper, tantalum, and silicon oxide layers were measured for each of the chemical-mechanical polishing systems. The values for copper dishing (in angstroms) of a bond pad (BP) region and copper erosion (in angstroms) of the E90 region (90% copper line density, 4.5 µm Cu lines separated by 0.5 µm space) were also measured. The removal rates, dishing, and erosion values are summarized in Table 4.

TABLE 4

Copper, Tantalum, and Silica Removal Rates

| Polishing Composition | Cu RR (Å/min) | Ta RR (Å/min) | Silica RR (Å/min) | BP Dishing (Å) | E90 Erosion (Å) | # Defects |
|---|---|---|---|---|---|---|
| 6A (none) | 2600 | 25 | 13 | 817 | 692 | 2876 |
| 6B (PSS) | 3300 | 47 | 10 | 745 | 443 | 1683 |

These results demonstrate that removal rates for polymer-coated abrasives are improved over the rates observed with traditional uncoated abrasives. Moreover, the dishing of the bond pad remains low while the erosion and number of surface defects is significantly reduced using colloidally stable polymer-coated abrasives.

EXAMPLE 7

This example evaluates the levels of surface roughness and scratching achieved during CMP with abrasive particles coated with polymeric complexing agents.

Similar rigid disk substrates containing nickel phosphide layers were polished using two different alumina abrasive chemical-mechanical polishing systems, each comprising 4 wt. % abrasive and 0.75 wt. % glycine at a pH of 2.5 (Polishing Compositions 7A and 7B). Polishing Composition 7A (control) contained uncoated alumina abrasive. Polishing Composition 7B (invention) contained alumina coated with polystyrenesulfonic acid/maleic anhydride copolymer. The removal rates for the nickel phosphide layers were determined for each of the chemical-mechanical polishing systems.

The removal rate for the nickel phosphide layer was 1397 Å/min for Polishing Composition 7A (control) and only 431.8 Å/min using Polishing Composition 7B (invention). However, Polishing Composition 7A produced heavy scratching on the substrate surface as compared to Polishing Composition 7B (invention), which produced very few scratches.

These results demonstrate that the polymer-coated abrasive particles produce significantly fewer surface defects than the traditional uncoated abrasive particles.

EXAMPLE 8

This example illustrates the importance of the relative amount of polymeric complexing agent to organic acid in the CMP system with respect to the number of surface defects on a substrate surface polished with the CMP system.

Similar patterned substrates comprising copper, tantalum, and silica layers were polished with five different chemical-mechanical polishing systems, each of which comprised the same polishing pad in conjunction with a different polishing composition (Polishing Compositions 8A, 8B, 8C, 8D, and 8E). Polishing Composition 8A (control) comprised 0.5 wt. % alumina coated with 0.054 wt. % polystyrenesulfonic acid (MW=75,000), 1.0 wt. % polyacrylic acid Compositions 8B (invention), 8C (invention), and 8D (comparative) were the same as Polishing Composition 8A, except that they also comprised 0.1, 0.69, and 1.6 wt. % lactic acid, respectively. Polishing Composition 8E (control) contained only 0.7 wt. % lactic acid with no polyacrylic acid and no polystyrenesulfonic acid. The pH of each of Polishing Compositions 8A–8E was adjusted to 4.1 with KOH. The removal rates (RR) for the copper layer of the substrates, as well as the copper bond pad (BP) dishing and E90 region (90% copper line density, 4.5 μm Cu lines separated by 0.5 μm space) erosion values, were measured for each of the chemical-mechanical polishing systems. The results are summarized in Table 5. The presence of surface defects was determined by evaluation of scanning electron microscopy (SEM) images of the polished substrates (FIGS. 1-8).

TABLE 5

Copper Removal Rates, Dishing, and Erosion Values

| Polishing Composition | Cu RR (Å/min) | BP Dishing (Å) | E90 Erosion (Å) | Surface Features |
|---|---|---|---|---|
| 8A (none) | 5029 | 881 | 247 | orange peel |
| 8B (0.1 wt. %) | 5004 | 812 | 32 | less orange peel |
| 8C (0.7 wt. %) | 6611 | 798 | 13 | clear |
| 8D (1.6 wt. %) | 8066 | 1122 | 141 | pitting |
| 8E (control) | 1800 | 844 | — | not evaluated |

Figure 2:
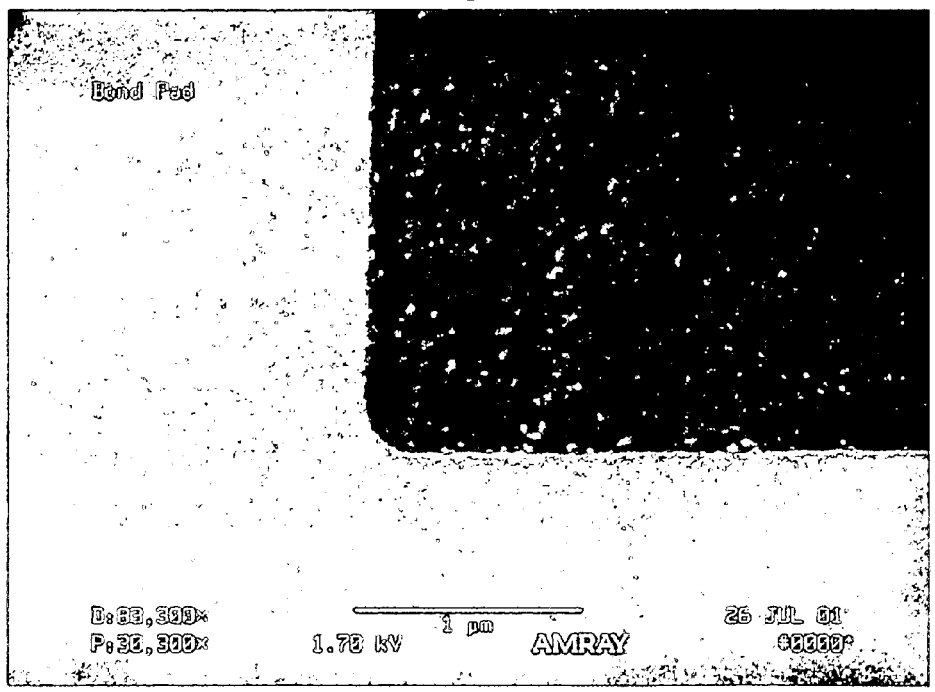
FIG. 2 is a SEM image of a second region of a substrate comprising copper and silicon oxide layers after chemical-mechanical polishing with a polishing composition, comprising 0.5 wt. % alumina, 0.054 wt. % polystyrenesulfonic acid, 1 wt. % polyacrylic acid, 3 wt. % hydrogen peroxide, and water, illustrating the presence of "orange peel" surface defects.
Figure 3:
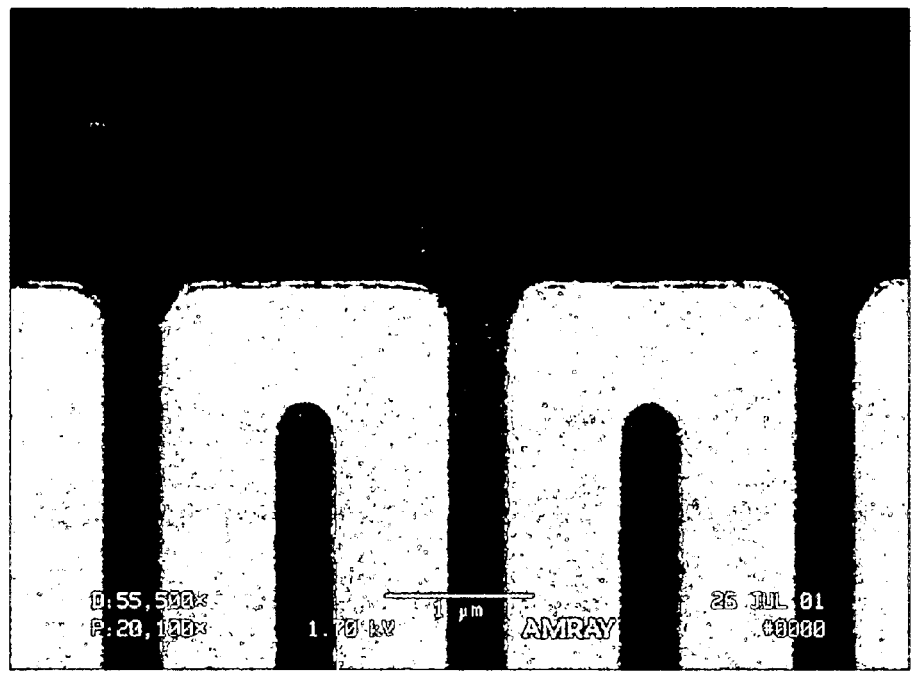
FIG. 3 is a SEM image of a first region of a substrate comprising copper and silicon oxide layers after chemical-mechanical polishing with a polishing composition, comprising 0.5 wt. % alumina, 0.054 wt. % polystyrenesulfonic acid, 1 wt. % polyacrylic acid, 0.1 wt. % lactic acid, and 3 wt. % hydrogen peroxide, illustrating the reduced presence of "orange peel" surface defects.
Figure 4:
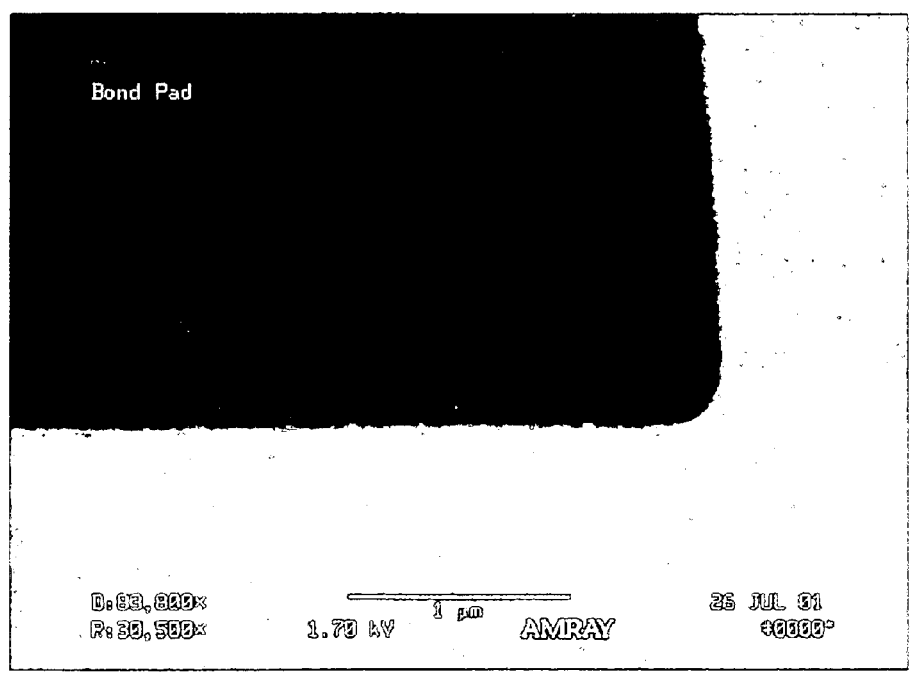
FIG. 4 is a SEM image of a second region of a substrate comprising copper and silicon oxide layers after chemical-mechanical polishing with a polishing composition, comprising 0.5 wt. % alumina, 0.054 wt. % polystyrenesulfonic acid, 1 wt. % polyacrylic acid, 0.1 wt. % lactic acid, and 3 wt. % hydrogen peroxide, illustrating the reduced presence of "orange peel" surface defects.
Figure 5:
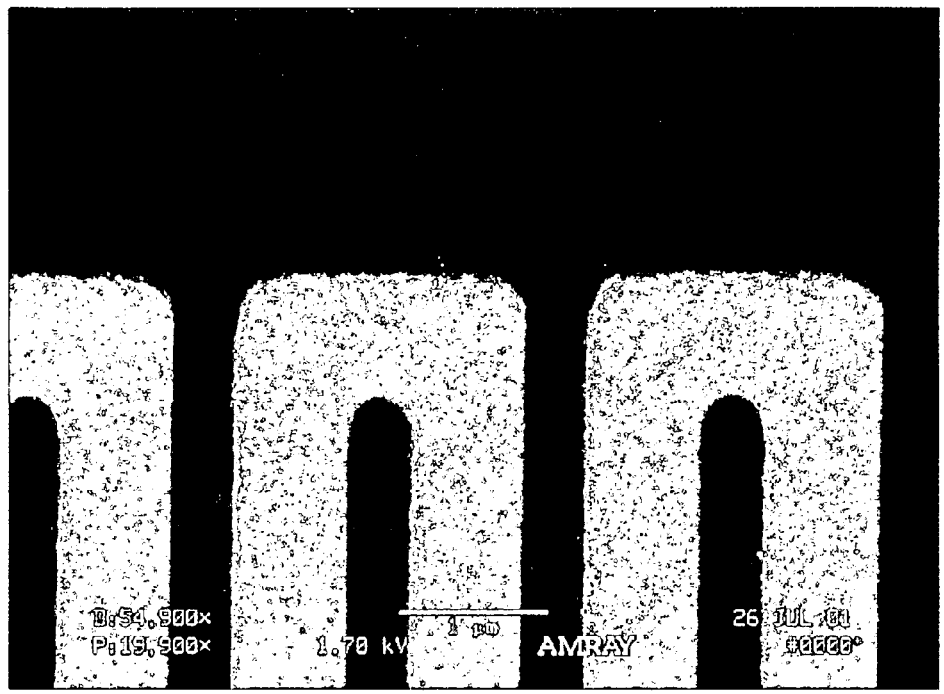
FIG. 5 is a SEM image of a first region of a substrate comprising copper and silicon oxide layers after chemical-mechanical polishing with a polishing composition, comprising 0.5 wt. % alumina, 0.054 wt. % polystyrenesulfonic acid, 1 wt. % polyacrylic acid, 0.69 wt. % lactic acid, and 3 wt. % hydrogen peroxide, illustrating the low incidence of surface defects.
Figure 6:
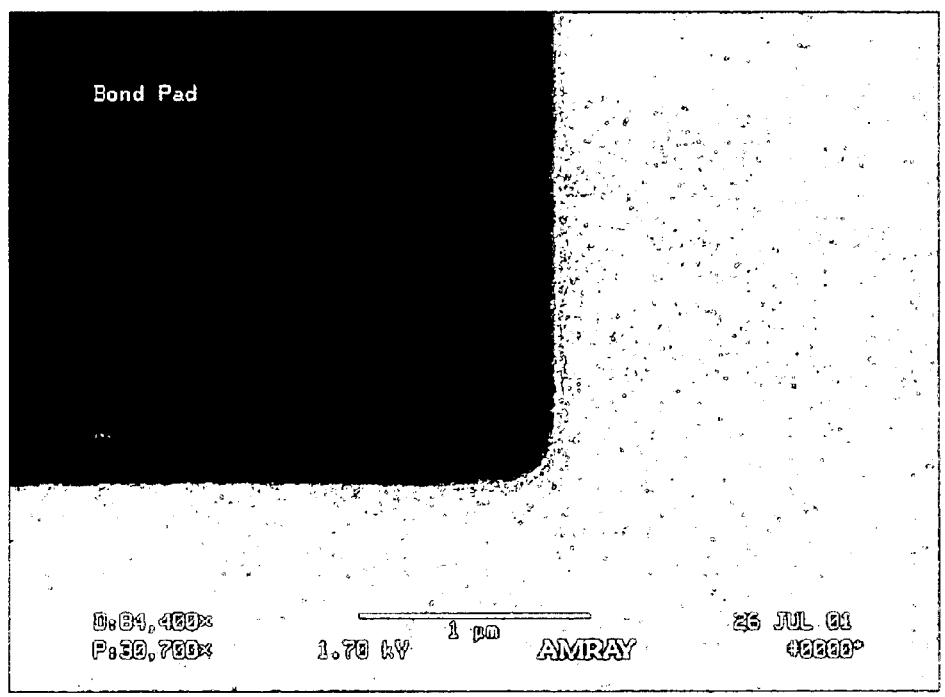
FIG. 6 is a SEM image of a second region of a substrate comprising copper and silicon oxide layers after chemical-mechanical polishing with a polishing composition, comprising 0.5 wt. % alumina, 0.054 wt. % polystyrenesulfonic acid, 1 wt. % polyacrylic acid, 0.69 wt. % lactic acid, and 3 wt. % hydrogen peroxide, illustrating the low incidence of surface defects.
Figure 7:
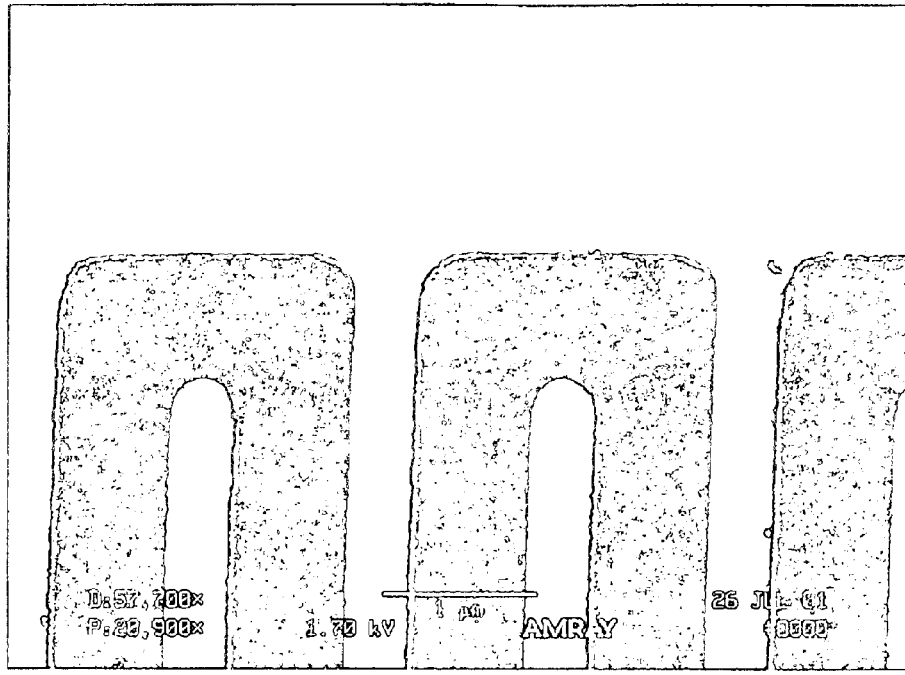
FIG. 7 is a SEM image of a first region of a substrate comprising copper and silicon oxide layers after chemical-mechanical polishing with a polishing composition, comprising 0.5 wt. % alumina, 0.054 wt. % polystyrenesulfonic acid, 1 wt. % polyacrylic acid, 1.6 wt. % lactic acid, and 3 wt. % hydrogen peroxide, illustrating the appearance of "pitting" surface defects.
Figure 8:
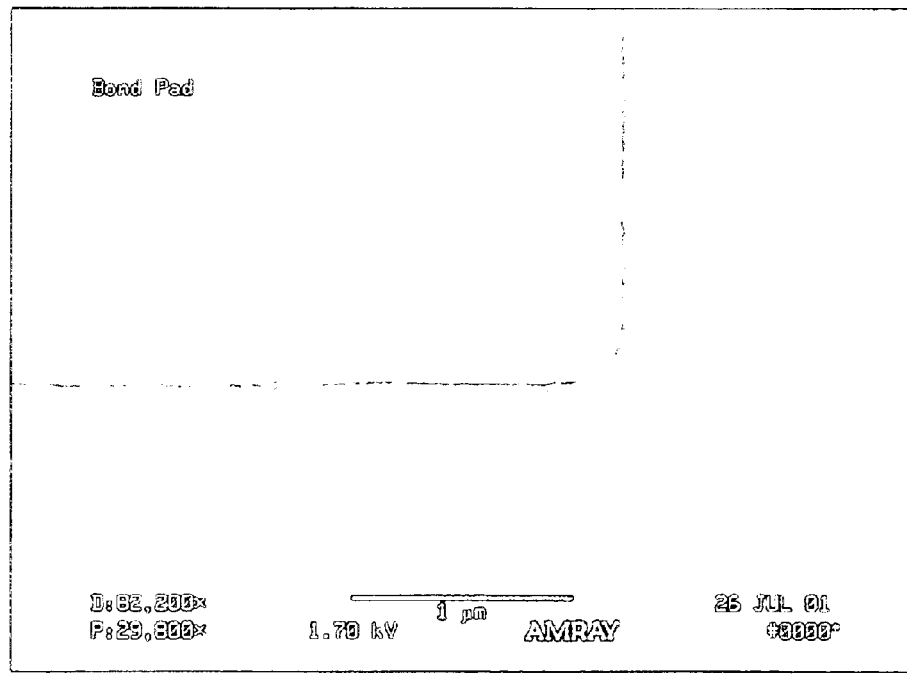
FIG. 8 is a SEM image of a second region of a substrate comprising copper and silicon oxide layers after chemical-mechanical polishing with a polishing composition, comprising 0.5 wt. % alumina, 0.054 wt. % polystyrenesulfonic acid, 1 wt. % polyacrylic acid, 1.6 wt. % lactic acid, and 3 wt. % hydrogen peroxide, illustrating the appearance of "pitting" surface defects.

In the absence of the organic acid, the substrate surface was highly eroded and was marked with an "orange peel" topography (see FIGS. 1 and 2). As small amounts of organic acid were added (e.g., 0.1 wt. %), the copper removal rate increased, and the presence of the "orange peel" lessened (see FIGS. 3 and 4) and then disappeared upon addition of 0.7 wt. % organic acid (see FIGS. 5 and 6). However, at higher levels of organic acid (e.g., 1.6 wt. %), the dishing of the bond pad became significant, and "pitting" was observed on the surface of the substrate (see FIGS. 7 and 8). In the absence of a polymeric complexing agent (Polishing Composition 8E), the copper removal rate was much slower (only 1800 Å/min).

These results demonstrate that the presence of a relatively small amount of organic acid in the CMP system comprising a carboxylic acid-containing polymeric complexing agent and a polymer-coated abrasive particle eliminates the presence of "orange peel" type surface defects on the polished substrate; however, too much organic acid leads to an increase in the occurrence of "pitting" and a significant amount of dishing of the substrate. Thus, a relative excess of polymeric complexing agent to organic acid is desirable to obtain a defect-free substrate surface. The addition of a relatively small amount of organic acid also serves to increase the copper polishing rate.

EXAMPLE 9

This example illustrates the effects of different carboxylic acid-containing polymeric complexing agents on the dishing values recorded after CMP of copper-containing substrates.

Similar patterned substrates comprising copper, tantalum, and silicon oxide layers were polished with three different chemical-mechanical polishing systems, each of which comprised the same polishing pad in conjunction with a different polishing composition (Polishing Compositions 9A, 9B, and 9C). Polishing Composition 9A (invention) comprised 0.5 wt. % alumina coated with 0.054 wt. % polystyrenesulfonic acid (MW=75,000), 1.0 wt. % polyacrylic acid (MW=85,000, tert-butyl peroxide initiator), and water, with 0.7 wt. % organic acid. Polishing Compositions 9B (invention) comprised 0.5 wt. % alumina coated with 0.054 wt. % polystyrenesulfonic acid (MW=75,000), 1.0 wt. % polyacrylic acid/acrylamido-2-methylpropane sulfonic acid copolymer (80:20 PAA:AMPS, MW=85,000), and water, with 0.7 wt. % organic acid. Polishing Composition 9C (invention) comprised 0.5 wt. % alumina coated with 0.054 wt. % polystyrenesulfonic acid (MW=75,000), 1.0 wt. % polyacrylic acid (MW=50,000, azo-based initiator), and water, with 0.7 wt. % organic acid. The pH of Polishing Compositions 9A, 9B, and 9C was adjusted to 4.1 with KOH. The values for copper dishing (in angstroms) were measured at different regions of the patterned substrate including at the bond pad (BP) region, 100 μm line, 50 μm line, and 10 μm line regions, 90% line density region (4.5 μm Cu lines separated by 0.5 μm space), and 50% line density region (2.5 μm Cu lines separated by 2.5 μm space) for each of the chemical-mechanical polishing systems. The results are summarized in Table 6.

TABLE 6

| | Bond Pad Dishing | | | | | |
|---|---|---|---|---|---|---|
| Polishing Composition | BP region (Å) | 100 μm line (Å) | 50 μm line (Å) | 10 μm line (Å) | 4.5 μm line (90%) (Å) | 2.5 μm line (50%) (Å) |
| 9A (PAA) | 1234 | 1519 | 1328 | 815 | 973 | 687 |
| 9B (PAA/AMPS) | 592 | 1115 | 1235 | 713 | 636 | 351 |
| 9C (PAA) | 299 | 338 | 344 | 216 | 129 | 87 |

These results demonstrate that the substrate dishing values are dependent on the type of monomers in the polymeric complexing agent, the molecular weight, and the type of polymer initiator used to prepare the polymeric complexing agent. In particular, the copolymer containing carboxylic acid groups (Polishing Composition 9B) provided significantly reduced bond pad dishing values compared with the values obtained using the homopolymeric complexing agent of comparable molecular weight (Polishing Composition 9A). Moreover, the use of a polyacrylic acid complexing agent prepared using an azo-based initiator (Polishing Composition 9C) resulted in significantly reduced substrate dishing values as compared with the values obtained using a polyacrylic acid complexing agent prepared using a tert-butyl peroxide initiator (Polishing Composition 9A).

EXAMPLE 10

This example illustrates the effect of the molecular weight of the polymeric complexing agent in the CMP system on the removal rate of copper from a substrate polished with the CMP system.

Similar substrates comprising copper layers were polished with eight different chemical-mechanical polishing systems, each of which comprised the same polishing pad in conjunction with a different polishing composition (Polishing Compositions 10A, 10B, 10C, 10D, 10E, 10F, 10G, and 10H). Polishing Compositions 10A–10H comprised 0.5 wt. % alumina, 1 wt. % polyacrylic acid, 0.054 wt. % polystyrenesulfonic acid (MW=75,000), and water (pH 4.5), with no non-polymeric organic acid. The polyacrylic acid used in the eight polishing compositions had molecular weights ranging from 10,000 up to 240,000. The removal rate for the copper layer of the substrate was measured for each of the chemical-mechanical polishing systems. A plot of the removal rate (Å/min) versus the molecular weight of the polyacrylic acid is shown in FIG. 9.

Figure 9:
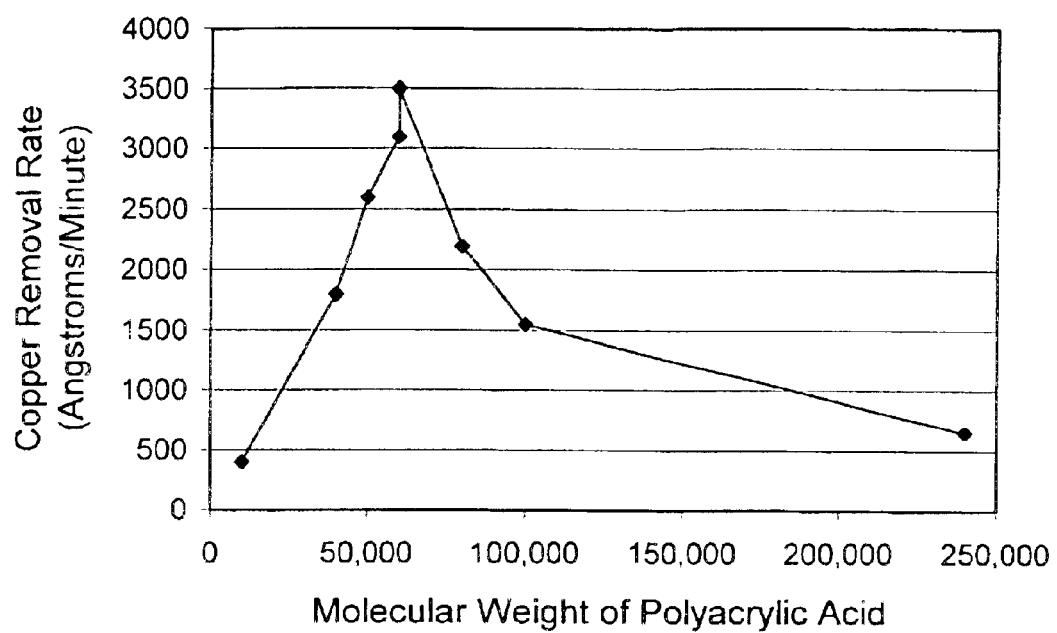
FIG. 9 is a graph of the molecular weight of the polymeric complexing agent versus the substrate removal rate measured during chemical-mechanical polishing, which illustrates the dependence of the removal rate on the molecular weight of the polymeric complexing agent.

As is apparent from the curve plotted in FIG. 9, the molecular weight of the polymeric complexing agent in the CMP system has a significant effect on the rate of substrate removal in a chemical-mechanical polishing process. While initially there is a significant increase in the substrate removal rate (in particular, copper removal rate) with increasing molecular weight of the polyacrylic acid complexing agent (up to about 50,000), the substrate removal rate then significantly decreases with further increases of the molecular weight of the polyacrylic acid complexing agent (up to about 100,000), with a slower rate of decrease with yet further increases of molecular weight of the polyacrylic acid complexing agent (through to at least about 250,000).

EXAMPLE 11

This example illustrates the importance of the type of non-polymeric organic acid used in combination with the polymeric complexing agent in the CMP system with respect to the number of surface defects on a substrate surface polished with the CMP system.

Similar patterned substrates comprising copper, tantalum, and silica layers were polished with different chemical-mechanical polishing systems, each of which comprised the same polishing pad in conjunction with a different polishing composition (Polishing Compositions 11A–11J). Polishing Composition 11A (invention) comprised 0.5 wt. % alumina coated with 0.056 wt. % polystyrenesulfonic acid (MW=75,000), 1.1 wt. % polyacrylic acid, and water, with no organic acid. Polishing Compositions 11B–11J (invention) were the same as Polishing Composition 11A, except that they also comprised 0.7 wt. % lactic acid, propionic acid, 2-methyl lactic acid, 3-hydroxybutyric acid, tartaric acid, malonic acid, glycolic acid, citric acid, and succinic acid, respectively. The pH of each of Polishing Compositions 11A–11J was adjusted to 4.1 with KOH. The removal rates (RR) for the copper layer of the substrates, as well as the values for copper dishing (in angstroms), were measured at the 100 μm line region and the 90% line density region (4.5 μm Cu lines separated by 0.5 μm space) of the patterned substrate for each of the chemical-mechanical polishing systems. The result are summarized in Table 7. The presence of surface defects was determined by evaluation of scanning electron microscopy (SEM) images of the polished substrates.

TABLE 7

| Copper Removal Rates, Dishing, and Erosion Values | | | | | |
|---|---|---|---|---|---|
| Polishing Composition | Organic Acid | Cu RR (Å/min) | 100 μm line (Å) | 4.5 μm line (90%) (Å) | Surface Features |
| 11A | none | 4148 | 2472 | 768 | pitting |
| 11B | lactic acid | 6659 | 2652 | 622 | none |
| 11C | propionic acid | 4601 | 2240 | 278 | none |
| 11D | 2-methyl lactic acid | 4567 | 1778 | 374 | none |
| 11E | 3-hydroxybutyric acid | 4587 | 2925 | 762 | minor corrosion |
| 11F | tartaric acid | 8654 | 2434 | 1603 | some corrosion |
| 11G | malonic acid | 8411 | 2501 | 1980 | some corrosion |

TABLE 7-continued

Copper Removal Rates, Dishing, and Erosion Values

| Polishing Composition | Organic Acid | Cu RR (Å/min) | 100 μm line (Å) | 4.5 μm line (90%) (Å) | Surface Features |
|---|---|---|---|---|---|
| 11H | glycolic acid | 7396 | 3130 | 1754 | some corrosion |
| 11I | citric acid | 15341 | 3684 | 3917 | severe corrosion |
| 11J | succinic acid | 9565 | 7261 | 7076 | severe corrosion |

Figure 10:
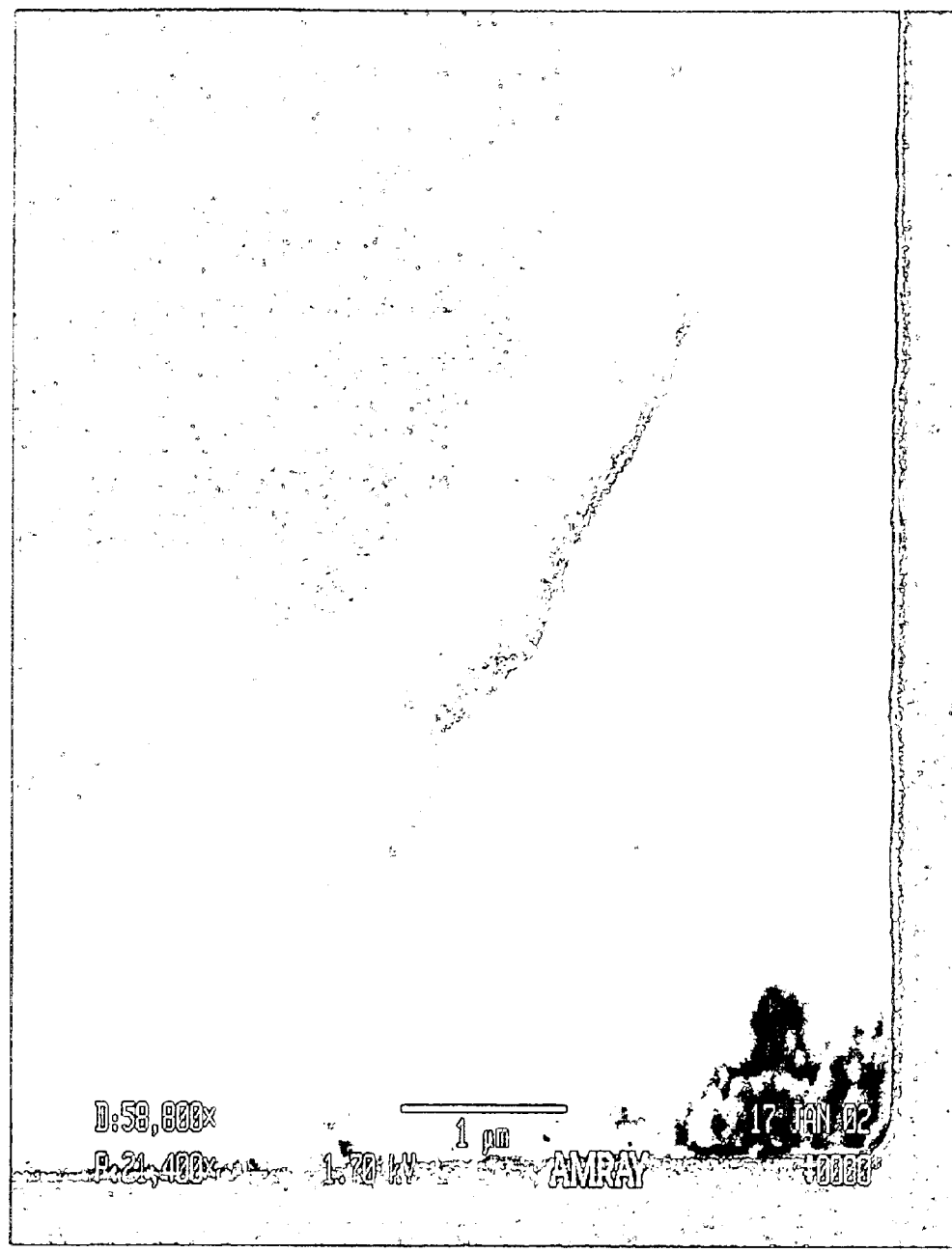
FIG. 10 is a SEM image of a region of a substrate comprising copper and silicon oxide layers after chemical-mechanical polishing with a polishing composition, comprising 0.5 wt. % alumina, 0.056 wt. % polystyrenesulfonic acid, 1.1 wt. % polyacrylic acid, 2 wt. % hydrogen peroxide, 0.7 wt. % citric acid, and water, illustrating the presence of severe corrosion.
Figure 11:
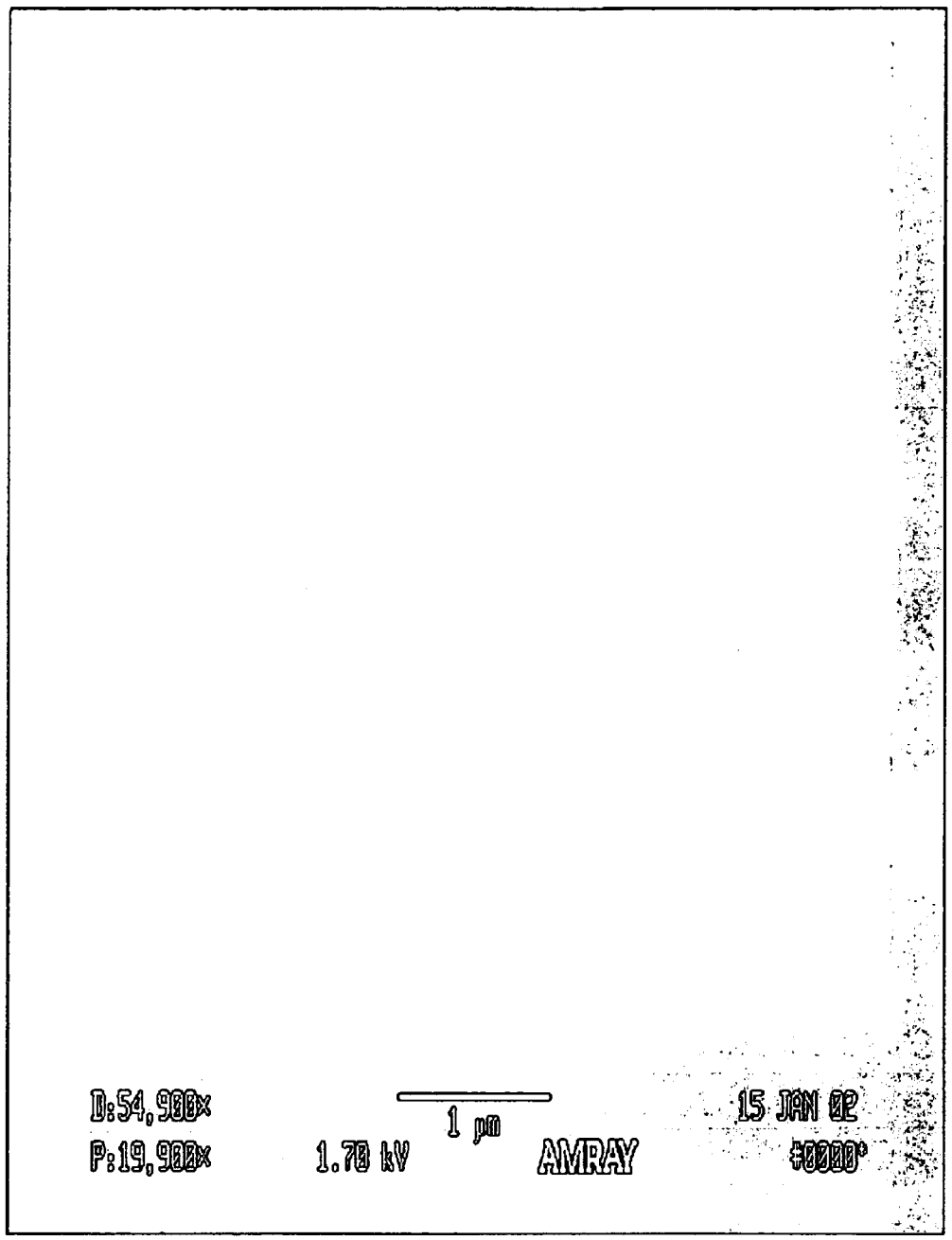
FIG. 11 is a SEM image of a region of a substrate comprising copper and silicon oxide layers after chemical-mechanical polishing with a polishing composition, comprising 0.5 wt. % alumina, 0.056 wt. % polystyrenesulfonic acid, 1.1 wt. % polyacrylic acid, 2 wt. % hydrogen peroxide, 0.7 wt. % 2-methyl lactic acid, and water, illustrating the absence of any surface defects.

As illustrated by the results summarized in Table 7, the addition of organic acid to the polishing composition of the invention improves the rate of copper removal (Polishing Composition 11A (control) as compared to Polishing Compositions 11B–11J). However, upon addition of some organic acids, the amount of copper dishing and erosion is markedly increased as is the occurrence of surface defects such as corrosion. In particular, organic acids such as tartaric acid, malonic acid, glycolic acid, citric acid, and succinic acid (Polishing Compositions 11F–11J) produce unacceptable levels of copper line dishing and erosion as well as moderate to severe corrosion of the substrate surface. FIG. 10 shows a SEM image of a copper-containing substrate that has been polishing with Polishing Composition 11I, illustrating the presence of severe corrosion. Contrastingly, organic acids such as lactic acid, propionic acid, 2-methyl lactic acid, and 3-hydroxybutyric acid (Polishing Compositions 11B–11E) provide only a small improvement in the copper removal rate, but substantially decrease the amount of copper line dishing and erosion and produce little to no corrosion on the substrate surface. FIG. 11 shows a SEM image of a copper-containing substrate that has been polishing with Polishing Composition 11D, illustrating the absence of any surface defects.

EXAMPLE 12

This example illustrates the importance of the presence of a nonionic surfactant in the CMP system with respect to the copper dishing and oxide erosion of a substrate surface polished with the CMP system.

Similar patterned substrates comprising copper, tantalum, and silica layers were polished with different chemical-mechanical polishing systems, each of which comprised the same polishing pad in conjunction with a different polishing composition (Polishing Compositions 12A and 12B). Polishing Composition 12A (invention) comprised 0.5 wt. % alumina coated with 0.06 wt. % polystyrenesulfonic acid (MW=75,000), 1.1 wt. % polyacrylic acid, 0.7 wt. % lactic acid, 3 wt. % hydrogen peroxide, and water, with no nonionic surfactant. Polishing Compositions 12B (invention) was the same as Polishing Composition 12A, except that it also comprised 250 ppm of a nonionic ethylenediamine polyoxyethylene surfactant. The pH of each of Polishing Compositions 12A and 12B was adjusted to 4 with KOH.

The removal rates (RR) for the copper layer of the substrates, as well as the value for copper dishing (in angstroms) at the copper bond pad region (BP) of the patterned substrate, and the oxide erosion for a region (E90) of 90% copper line density (4.5 μm Cu lines separated by 0.5 μm space) were measured for each of the chemical-mechanical polishing systems. The results are summarized in Table 8.

TABLE 8

Copper Removal Rates, Dishing, and Erosion Values

| Polishing Composition | Nonionic Surfactant | Cu RR (Å/min) | BP Dishing (Å) | E90 Erosion (Å) |
|---|---|---|---|---|
| 12A | none | 7218 | 2250 | 318 |
| 12B | ethylenediamine polyoxyethylene | 7104 | 1260 | 182 |

As illustrated by the results summarized in Table 8, the addition of a nonionic surfactant to the polishing composition of the invention greatly reduces the amount of copper dishing and oxide erosion.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of polishing a substrate comprising a metal layer comprising copper, wherein said method comprises the steps of:
   (i) providing a chemical-mechanical polishing system comprising:
      (a) a liquid carrier,
      (b) a polishing pad,
      (c) an abrasive, and
      (d) a negatively-charged polymer or copolymer,
   wherein the negatively-charged polymer or copolymer (i) comprises one or more monomers selected from the group consisting of sulfonic acids, sulfonates, sulfates, phosphonic acids, phosphonates, and phosphates, (ii) has a molecular weight of about 20,000 g/mol or more, and (iii) coats at least a portion of the abrasive such that the abrasive has a zeta potential value that is lowered upon interaction of the negatively-charged polymer or copolymer with the abrasive,
   (ii) contacting a substrate comprising a metal layer comprising copper with the chemical-mechanical polishing system, and
   (iii) abrading at least a portion of the substrate to polish the metal layer of the substrate.

2. The method of claim 1, wherein the negatively-charged polymer or copolymer has a molecular weight of about 40,000 g/mol to about 500,000 g/mol.

3. The method of claim 1, wherein the negatively-charged polymer or copolymer comprises one or more monomers selected from the group consisting of styrenesulfonic acid, vinylsulfonic acid, 2-acrylamido-2-methylpropane sulfonic acid, and vinylphosphonic acid.

4. The method of claim 3, wherein the negatively-charged polymer or copolymer is selected from the group consisting of polystyrenesulfonic acid, poly(2-acrylamido-2-methylpropane sulfonic acid), and copolymers thereof.

5. The method of claim 1, wherein the negatively-charged polymer or copolymer comprises a mixture of anionic and nonionic monomers.

6. The method of claim 1, wherein the abrasive is a metal oxide selected from the group consisting of alumina, silica, titania, ceria, zirconia, germania, magnesia, co-formed products thereof, and combinations thereof.

7. The method of claim 6, wherein the metal oxide is alumina.

8. The method of claim 1, wherein the abrasive is fixed on the polishing pad.

9. The method of claim 1, wherein the abrasive is in particulate form and is suspended in the liquid carrier.

10. The method of claim 9, wherein the amount of abrasive is about 2 wt. % or less, and the amount of negatively-charged polymer or copolymer is about 0.2 wt. % or less based on the weight of the liquid carrier and any components dissolved or suspended therein.

11. The method of claim 1, wherein the system has a pH of about 7 or less.

12. The method of claim 11, wherein the pH is about 2 to about 6.

13. The method of claim 1, wherein the system further comprises a polymeric complexing agent comprising carboxylic acid or carboxylate monomers.

14. The method of claim 13, wherein the polymeric complexing agent has a molecular weight of about 10,000 g/mol or more.

15. The method of claim 1, wherein the system further comprises an organic acid.

16. The method of claim 15, wherein the organic acid is a carboxylic acid.

17. The method of claim 16, wherein the carboxylic acid is a monocarboxylic acid selected from the group consisting of lactic acid, propionic acid, 2-hydroxybutyric acid, 3-hydroxybutyric acid, 2-methyl lactic acid, salts thereof, and combinations thereof.

18. The method of claim 13, wherein the system further comprises an organic acid.

19. The method of claim 18, wherein the organic acid is a carboxylic acid selected from the group consisting of lactic acid, propionic acid, 2-hydroxybutyric acid, 3-hydroxybutyric acid, 2-methyl lactic acid, salts thereof, and combinations thereof.

20. The method of claim 19, wherein the amount of the carboxylic acid is about 90% or less than the amount of the polymeric complexing agent based on a weight basis.

21. The method of claim 20, wherein the amount of the carboxylic acid is about 80% or less than the amount of the polymeric complexing agent based on a weight basis.

22. The method of claim 21, wherein the amount of the carboxylic acid is about 70% or less than the amount of the polymeric complexing agent based on a weight basis.

23. The method of claim 19, wherein the amount of the carboxylic acid is about 10% or more than the amount of the polymeric complexing agent based on a weight basis.

24. The method of claim 1, wherein the system further comprises one or more components selected from the group consisting of oxidizing agents, corrosion inhibitors, pH adjustors, and surfactants.

25. The method of claim 24, wherein the system comprises an oxidizing agent and the oxidizing agent is a peroxide.

26. The method of claim 24, wherein the system comprises a corrosion inhibitor and the corrosion inhibitor is benzotriazole.

27. The method of claim 24, wherein the system comprises a surfactant and the surfactant is a nonionic surfactant.

28. The method of claim 1, wherein the substrate further comprises a metal layer comprising tantalum.

29. The method of claim 1, wherein the substrate further comprises an insulating layer.

30. The method of claim 18, wherein the system comprises about 0.5 wt. % abrasive, about 0.05 wt. % negatively-charged polymer or copolymer, about 1 wt. % polymeric complexing agents, and about 0.7 wt. % organic acid based on the weight of the liquid carrier and any components dissolved or suspended therein.

* * * * *